US008227771B2

(12) United States Patent
Soer et al.

(10) Patent No.: US 8,227,771 B2
(45) Date of Patent: Jul. 24, 2012

(54) DEBRIS PREVENTION SYSTEM AND LITHOGRAPHIC APPARATUS

(75) Inventors: Wouter Anthon Soer, Nijmegen (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 620 days.

(21) Appl. No.: 11/878,306

(22) Filed: Jul. 23, 2007

(65) Prior Publication Data

US 2009/0027637 A1 Jan. 29, 2009

(51) Int. Cl.
*A61N 5/00* (2006.01)
(52) U.S. Cl. .................. 250/492.2; 250/492.1
(58) Field of Classification Search .... 250/492.1–492.3, 250/493.1–504 R
See application file for complete search history.

(56) References Cited

U.S. PATENT DOCUMENTS

| | | | | |
|---|---|---|---|---|
| 6,064,072 A * | 5/2000 | Partlo et al. | ............... | 250/504 R |
| 6,172,324 B1 * | 1/2001 | Birx | .................. | 219/121.57 |
| 6,389,106 B1 * | 5/2002 | Neff et al. | ................ | 378/122 |
| 6,414,438 B1 * | 7/2002 | Borisov et al. | ........... | 315/111.31 |
| 6,452,199 B1 * | 9/2002 | Partlo et al. | .............. | 250/504 R |
| 6,541,786 B1 * | 4/2003 | Partlo et al. | .............. | 250/504 R |
| 6,566,667 B1 * | 5/2003 | Partlo et al. | .............. | 250/504 R |
| 6,566,668 B2 * | 5/2003 | Rauch et al. | .............. | 250/504 R |
| 6,586,757 B2 * | 7/2003 | Melnychuk et al. | ...... | 250/504 R |
| 6,788,763 B1 * | 9/2004 | Neff et al. | .................. | 378/119 |
| 6,815,700 B2 * | 11/2004 | Melnychuk et al. | ...... | 250/504 R |
| 6,815,900 B2 * | 11/2004 | Ahmad et al. | ........... | 315/111.21 |
| 6,838,684 B2 * | 1/2005 | Bakker et al. | .............. | 250/492.2 |
| 6,885,015 B2 * | 4/2005 | Wester | ....................... | 250/504 R |
| 6,972,421 B2 * | 12/2005 | Melnychuk et al. | ...... | 250/504 R |
| 6,998,785 B1 * | 2/2006 | Silfvast et al. | ........... | 315/111.71 |
| 7,115,887 B1 * | 10/2006 | Hassanein et al. | ........ | 250/504 R |
| 7,122,816 B2 * | 10/2006 | Algots et al. | .............. | 250/504 R |
| 7,180,081 B2 * | 2/2007 | Walker et al. | ............. | 250/504 R |
| 7,180,082 B1 * | 2/2007 | Hassanein et al. | ........ | 250/504 R |
| 7,230,258 B2 * | 6/2007 | Ruzic et al. | ............... | 250/504 R |
| 7,323,701 B2 * | 1/2008 | Vaudrevange et al. | .... | 250/504 R |
| 7,365,350 B2 * | 4/2008 | Tran et al. | .................. | 250/504 R |
| 7,368,741 B2 * | 5/2008 | Melnychuk et al. | ...... | 250/504 R |
| 7,405,416 B2 * | 7/2008 | Algots et al. | .............. | 250/493.1 |
| 7,427,766 B2 * | 9/2008 | Jonkers et al. | ............ | 250/504 R |
| 7,442,948 B2 * | 10/2008 | Wassink | .................... | 250/504 R |
| 7,449,703 B2 * | 11/2008 | Bykanov | ................... | 250/504 R |
| 7,485,881 B2 * | 2/2009 | Wassink et al. | ............ | 250/504 R |
| 7,488,962 B2 * | 2/2009 | Korobochko et al. | .... | 250/504 R |
| 7,518,300 B2 * | 4/2009 | Bosch et al. | ............. | 313/231.31 |
| 7,528,395 B2 * | 5/2009 | Koshelev et al. | .......... | 250/493.1 |
| 7,531,820 B2 * | 5/2009 | Hergenhan et al. | ....... | 250/504 R |
| 7,839,482 B2 * | 11/2010 | Soer et al. | ........................ | 355/30 |
| 2002/0014598 A1 * | 2/2002 | Melnychuk et al. | ...... | 250/504 R |
| 2002/0014599 A1 * | 2/2002 | Rauch et al. | .............. | 250/504 R |
| 2002/0100882 A1 * | 8/2002 | Partlo et al. | .............. | 250/504 R |
| 2003/0006383 A1 * | 1/2003 | Melnychuk et al. | ...... | 250/504 R |

(Continued)

*Primary Examiner* — David A Vanore
*Assistant Examiner* — Andrew Smyth
(74) *Attorney, Agent, or Firm* — Pillsbury Winthrop Shaw Pittman LLP (57) ABSTRACT

A debris prevention system is constructed and arranged to prevent debris emanating from a radiation source from propagating with radiation from the radiation source into or within a lithographic apparatus. The debris prevention system includes a first foil trap that is rotatable around an axis of rotation, and a second foil trap that at least partly encloses the first foil trap. The second foil trap includes a plurality of foils optically open respective to a central location for placement of a radiation source and optically closed respective to directions perpendicular to the axis of rotation.

20 Claims, 4 Drawing Sheets

U.S. PATENT DOCUMENTS

| | | | |
|---|---|---|---|
| 2004/0105082 A1* | 6/2004 | Koshelev et al. | 355/53 |
| 2004/0108473 A1* | 6/2004 | Melnychuk et al. | 250/504 R |
| 2004/0135103 A1* | 7/2004 | Wester | 250/504 R |
| 2004/0145292 A1* | 7/2004 | Ahmad et al. | 313/231.31 |
| 2004/0160155 A1* | 8/2004 | Partlo et al. | 313/231.31 |
| 2005/0195506 A1* | 9/2005 | McGuire, Jr. | 359/861 |
| 2005/0230645 A1* | 10/2005 | Melnychuk et al. | 250/504 R |
| 2006/0113498 A1* | 6/2006 | Vaudrevange et al. | 250/504 R |
| 2006/0138362 A1* | 6/2006 | Bakker et al. | 250/504 R |
| 2006/0139604 A1* | 6/2006 | Wassink et al. | 355/67 |
| 2006/0186353 A1* | 8/2006 | Wassink | 250/492.2 |
| 2006/0192154 A1* | 8/2006 | Algots et al. | 250/504 R |
| 2006/0192155 A1* | 8/2006 | Algots et al. | 250/504 R |
| 2006/0193997 A1* | 8/2006 | Bykanov | 427/585 |
| 2006/0219958 A1* | 10/2006 | Wassink | 250/504 R |
| 2006/0243927 A1* | 11/2006 | Tran et al. | 250/504 R |
| 2006/0273732 A1* | 12/2006 | Korobochko et al. | 315/111.21 |
| 2007/0001571 A1* | 1/2007 | Bosch et al. | 313/231.31 |
| 2007/0023706 A1* | 2/2007 | Sjmaenok et al. | 250/504 R |
| 2007/0085044 A1* | 4/2007 | Hergenhan et al. | 250/504 R |
| 2007/0090304 A1* | 4/2007 | Jonkers et al. | 250/504 R |
| 2007/0125968 A1* | 6/2007 | Klunder et al. | 250/504 R |
| 2007/0235666 A1* | 10/2007 | Ruzic et al. | 250/504 R |
| 2008/0067454 A1* | 3/2008 | Wassink | 250/504 R |
| 2008/0192218 A1* | 8/2008 | Krivtsun et al. | 355/53 |
| 2008/0225245 A1* | 9/2008 | Wood et al. | 355/30 |
| 2008/0291406 A1* | 11/2008 | Soer et al. | 355/30 |

* cited by examiner

Figure 5 ns DEBRIS PREVENTION SYSTEM AND
LITHOGRAPHIC APPARATUS

FIELD

The present invention relates to a debris prevention system, and lithographic apparatus that includes a debris prevention system. More specifically, the present invention relates to a debris intercepting system for intercepting contaminant material coming from a debris generating foil trap.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In addition to EUV radiation, radiation sources used in EUV lithography generate contaminant material that may be harmful for the optics and the working environment in which the lithographic process is carried out. Hence, in EUV lithography, a desire exists to limit the contamination of the optical system that is arranged to condition the beams of radiation coming from an EUV source. To this end, it is known to use a so-called rotating foil trap, for example, as disclosed in U.S. Pat. No. 6,838,684. A foil trap uses a high number of closely packed foils aligned generally parallel to the direction of the radiation from the EUV source. Contaminant debris, such as micro-particles, nano-particles and ions may be intercepted by the rotating foil plates. Thus, the foil trap functions as a contamination barrier intercepting contaminant material from the source. However, the rotating foil trap may introduce a risk of secondary contamination of the system.

SUMMARY

It is desirable to reduce the risk of secondary contamination in the presence of a rotating foil trap.

According to an aspect of the invention, there is provided a debris prevention system that is constructed and arranged to prevent debris emanating from a radiation source from propagating with radiation from the radiation source into or within a lithographic apparatus. The debris prevention system includes a first foil trap that is rotatable around an axis of rotation, and a second foil trap that at least partly encloses the first foil trap. The second foil trap includes a plurality of foils optically open respective to a central location for placement of a radiation source and optically closed respective to directions perpendicular to the axis of rotation.

According to an aspect of the invention, there is provided a lithographic apparatus that includes an illumination system configured to condition a radiation beam, and a support constructed to support a patterning device. The patterning device is configured to impart the radiation beam with a pattern in its cross-section to form a patterned radiation beam. The apparatus also includes a substrate table constructed to hold a substrate, a projection system configured to project the patterned radiation beam onto a target portion of the substrate, and a debris prevention system configured to provide the radiation beam. The debris prevention system is constructed and arranged to prevent debris emanating from a radiation source from propagating with radiation from the radiation source into or within the lithographic apparatus. The debris prevention system includes a first foil trap rotatable around an axis of rotation, and a second foil trap that at least partly encloses the first foil trap. The second foil trap includes a plurality of foils optically open respective to a central location for placement of a radiation source and optically closed respective to directions perpendicular to the axis of rotation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
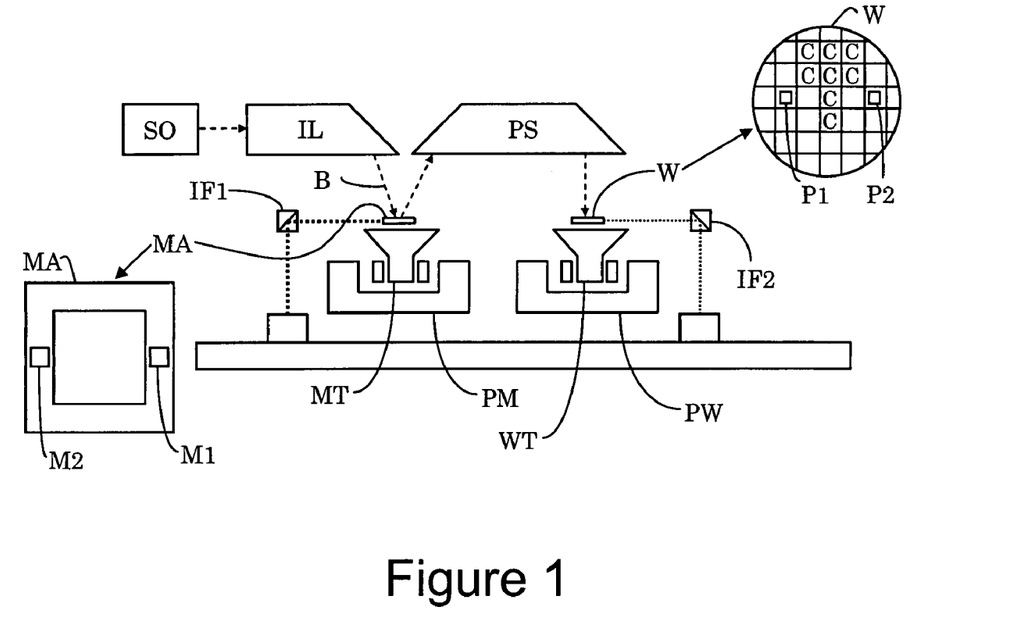
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if desired, may be referred to as a radiation system.

In some instances, in accordance with embodiments of the invention, the source may comprise a discharge produced or laser produced plasma source. In particular, the source may comprise a discharge source for generating extreme ultraviolet radiation. In some instances, the discharge source may comprise a pair of electrodes to be provided with a voltage difference and a system for producing a discharge between the pair of electrodes. That is, circuitry may be provided to generate a discharge for providing a pinched plasma in a central area between the electrodes. In accordance with these embodiments, the plasma source may comprise tin, lithium or xenon.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a collector. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
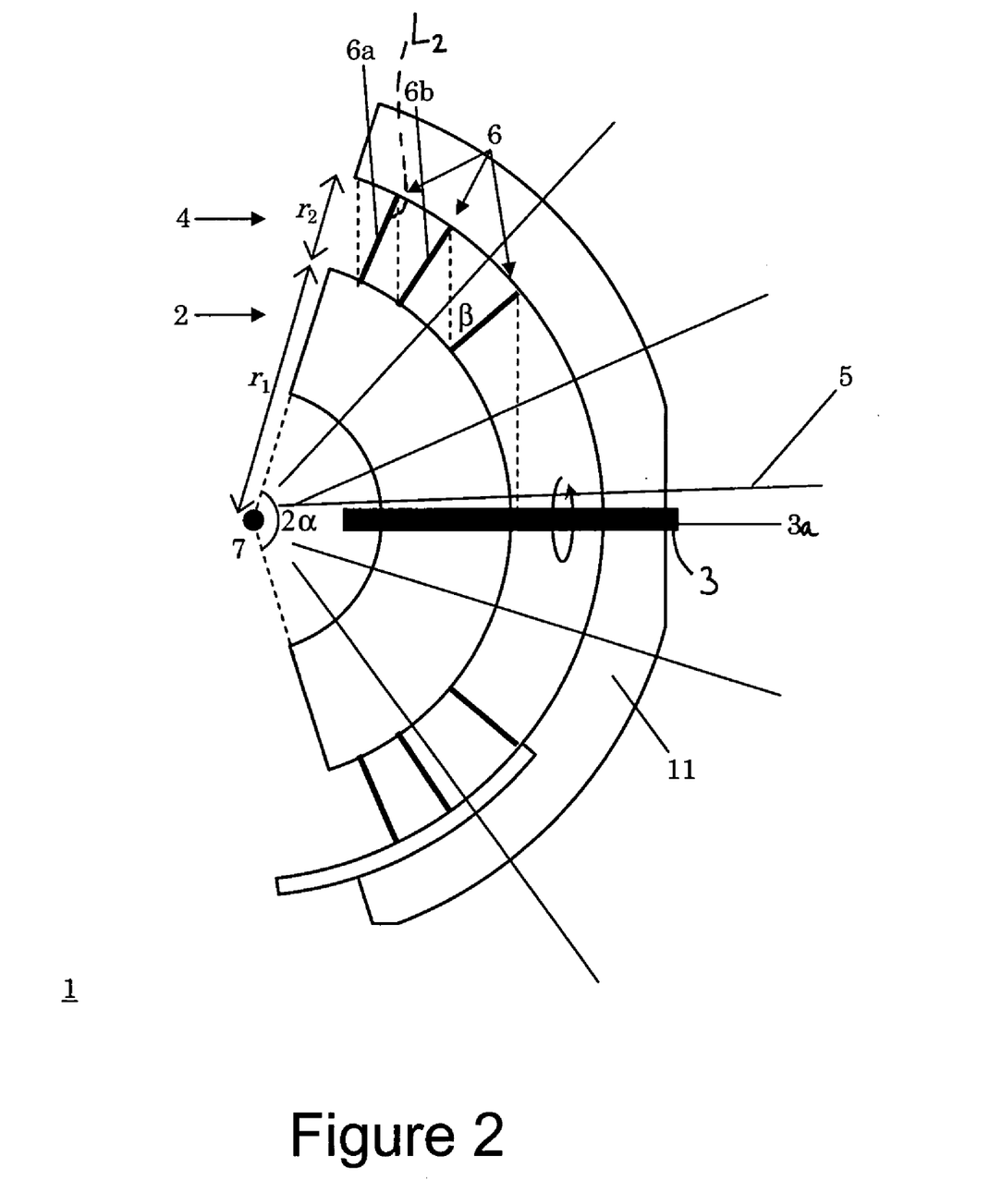
FIG. 2 shows a sectional view of an axial cross section of a debris prevention system according to an embodiment of the invention.

Turning to FIG. 2 a debris prevention system 1, including a radiation system, in FIG. 1 generally indicated as source SO is illustrated in more detail. In this system 1, a first foil trap 2 is provided. The foil trap is comprised of a rotatable shaft 3 that defines a rotation axis 3a wherein, in radial directions relative to the shaft 3, a plurality of foils, typically several tens of foils are provided in a cup-formed shape extending beyond the shaft 3 to cover an emission angle 2α of a radiation source 7. The source is for example of a discharge source exemplified in the description of FIG. 1.

The rotatable foil trap 2 can be further of a conventional type for example as disclosed in U.S. Pat. No. 6,838,684 incorporated herein by reference. Further away from the source 7, a collector 11 is schematically illustrated. The collector 11 receives extreme ultraviolet radiation radiated from the source 7. The collector can be of a conventional type for example a grazing incidence type or a normal incidence type. In one aspect of the embodiment a second foil trap 4 is arranged in an optical path between the rotating foil trap 2 and the collector 11. The second foil trap 4 or barrier is defined by a plurality of static foils 6, which are preferably aligned in a generally radial direction respective to the central source location 7 of the radiation source 1.

Here "generally" radial means that from a geometric center formed by the source location the foil planes are coincident with any of radial lines. However, "generally radial" may also be understood as an alignment wherein the foils are placed under a very small angle, for instance to provide a grazing incidence type of foil trap. This latter embodiment may provide a benefit of focusing extreme ultraviolet radiation.

Without intercepting, particles caught by the rotating foil trap 2, due to centrifugal action on these particles may be re-emitted and may contaminate the collector 11. The second foil trap 4 according to this invention functions to intercept debris emitted from the rotating foil trap 2, which allows the collector 11 (or any other component to be kept free from micro particles) to be placed much closer to the source and still be protected against particles emitted by the rotating foil trap.

In FIG. 2, the collector area is schematically illustrated as a shaded area 11. The second foil trap 4 or barrier is provided in the space present in a direction, seen from the central source location 7, away from outer radius r1 defining the dimension of central foil trap 2 and has a radial size r2. The second foil trap 4 can be constructed as follows. Preferably, to minimize additional obscuring by the foils 6 of the second foil trap 4, a minimum amount of foils is used while keeping the system optically closed in a direction seen perpendicular to the rotation axis 3a. That is, preferably for an angle increasing between 0 and 90° relative to the rotation axis, the number of foils is interspaced at distances decreasing with an angle β relative to the rotation axis 3a of the foil trap 2. Indeed, for foils radially aligned respective to source 7, the number can be kept minimal by drawing lines perpendicular to the axis of rotation 3a of the foil trap 2 and ensuring that at least, and preferably at most, one foil is intersected. Preferably only one foil is arranged but preferably at most 3 foils may be arranged to intersect a line perpendicular relative to the axis of rotation 3a.

A construction of the second foil trap 4 can be described as follows. From an outer most point of the collector 11, a line ($L_1$ in FIG. 2) is drawn perpendicular to the rotation axis 3a of foil trap 2. The intersection of this line with the rotating foil trap 2 marks the start of a first foil 6a. This foil 6a is aligned with the central pinch location 7 and runs as far as the available space allows. From the end of this foil 6a, another line ($L_2$) is drawn perpendicular to the rotation axis 3a, which marks the start of the second foil 6b. This procedure is continued until the foils 6 extend further down the axis of rotation 3a than the foil trap 2. The second foil trap 4 is preferably rotationally symmetric about axis 3.

Figure 3:
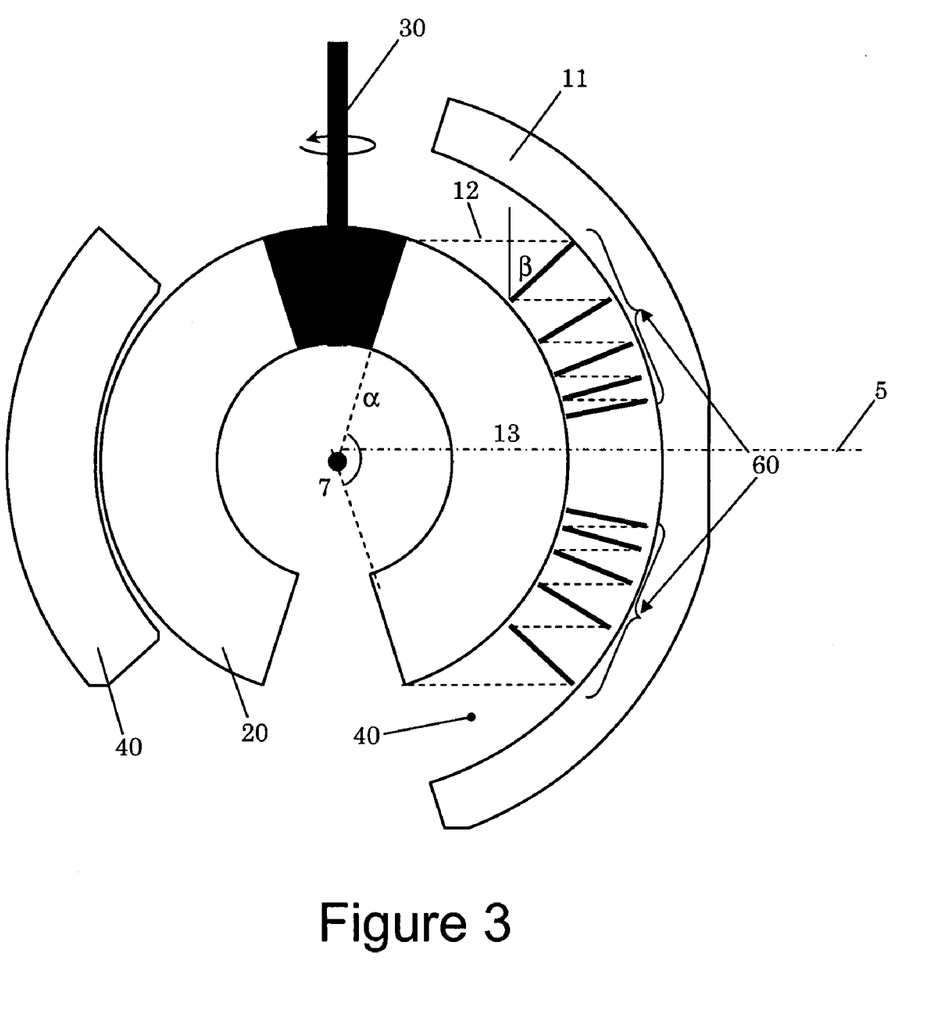
FIG. 3 shows a sectional view according to an axial cross section of the debris prevention system according to an embodiment of the invention.

FIG. 3 shows the debris prevention system according to an embodiment of the invention. In this embodiment another rotating foil trap 20 is illustrated which could be regarded as a "wheel of fortune" type of foil trap. This type of foil trap is arranged to rotate around and encloses the radiation source, rather than in front of the source. This may allow the foils to be shielded from radiation heat during a fraction of the rotation cycle. This may reduce the heat load on foils and may provide additional possibilities for cooling of the area outside an emission angle of the source 7 in the shown embodiment.

An optical axis 5 of a collector 11 is, according to this embodiment, generally arranged in a plane parallel to centrifugal directions of debris emitted from the foil trap 20.

Accordingly, debris that is re-emitted from the foil trap 20 may contaminate the system in down stream direction.

Although other types of interceptive arrangements can be provided, typically, according to an embodiment of the invention, here, also a second generally stationary foil trap can be provided that is aligned in a radial direction respective to a central location 7 of the radiation source. In particular this second foil trap 40 also comprises a plurality of foils 60. The orientation of the foils can be generally the same as in the FIG. 2 embodiment and includes a general alignment of the foils in radial directions seen from a central location.

In an embodiment, both the FIG. 2 and FIG. 3 foil traps are shaped according to a conical shape having an apex at the light source and a symmetry axis lined along the rotation axis of the rotatable foil trap 2, 20.

Accordingly, the embodiment of FIG. 3 is distinct from the FIG. 2 embodiment in that the rotation axis 30 of the first foil trap 20 is directed generally transverse to the optical axis 5 of the collector system 11. Typically, although it should be clear that also non-perpendicular directions are possible, in this embodiment, an optical axis 5 is defined perpendicular to this rotation axis 30. Also in this embodiment, only a single foil 6 may intercept a line 12 drawn perpendicular to the axis of rotation. The rotatable foil trap 20 of this embodiment comprises a shaft 30 and foils arranged radially respective to the shaft 30. The foils enclose a central area in which a source 7 can be arranged. This foil trap 40 is configured such that radiation within an angle α from the optical axis 5 can be collected as in the embodiment of FIG. 2. Also, this embodiment is optically closed in a direction perpendicular to the rotation axis of the rotatable foil trap 20 while being optically open as seen in radial directions from the extreme ultraviolet source 7. In this respect, optically open can be regarded as substantially transmittive for extreme ultraviolet radiation, which means that the foils do not provide an optical blocking but are aligned or provide a grazing incidence for the radiation emitted from the source. In one aspect of the embodiment of FIG. 3, a central area 13 near the optical axis is not protected from debris emitted from the rotating foil trap 20 since the traveling path of debris particles coming from the source are aligned with the foils 6 of the second foil trap 40. This central area 13 can be protected otherwise against debris or will not be used for collecting extreme ultraviolet radiation.

Figure 4:
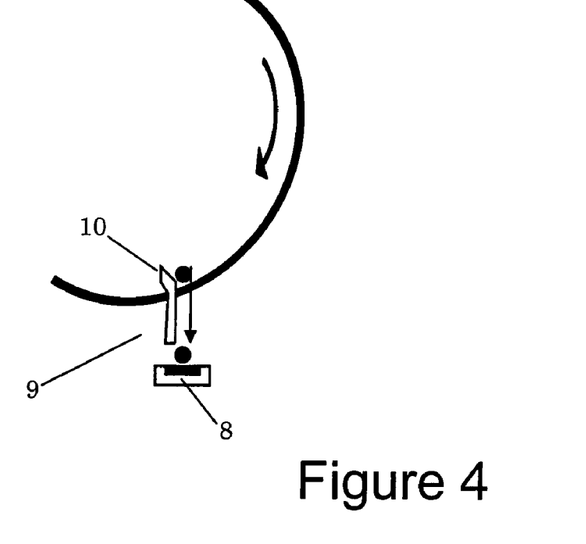
FIG. 4 shows a schematic illustration of a cleaning arrangement of the debris prevention system according to an embodiment of the invention.

FIG. 4 shows an embodiment of a cleaning system 9 in conjunction with the foil traps 4, 40 of FIGS. 2 and 3 in particular a cleaning system for cleaning a foil 6, 60 of the foil traps 4, 40. Generally, each of the second foil traps 4, 40 may be arranged in a conical shape having an apex coinciding with a central location of the pinch plasma source 7. Due to rotational symmetry, the (conical) foils 6, preferably concentrically stacked having an axis of symmetry aligned with an axis of rotation of the first foil trap 2, 20, can be rotated around that symmetry axis so that a cleaning system 9 is able to clean the foils 6 by chemical or mechanical cleaning action. The embodiment of FIG. 4 in particular shows a removal of debris, such as tin debris from foil 6. This can be also done by heating, or by reaction with halogens, hydrogen or hydrogen radicals. To prevent redeposition of Sn debris on the collector, the source may be turned off and the second foil trap 4 is cleaned off line.

For instance, the collector may be physically separated by a separation wall from the foil trap 2 during cleaning. The cleaning system 9 preferably comprises an outlet channel 8 arranged near the lowest point of the second foil trap in the direction of gravity. In this way, during use, collected debris may flow to a lowest point and leak out of the foil trap into the outlet channel 8. The cleaning system can be comprised of a wiper 10 or a nozzle, arranged to direct a cleaning substance such as halogens, hydrogen or hydrogen radicals referenced above. The rotation frequency is preferably kept relatively low, for instance in a range between about 0.1 Hz and about 10 Hz.

Figure 5:
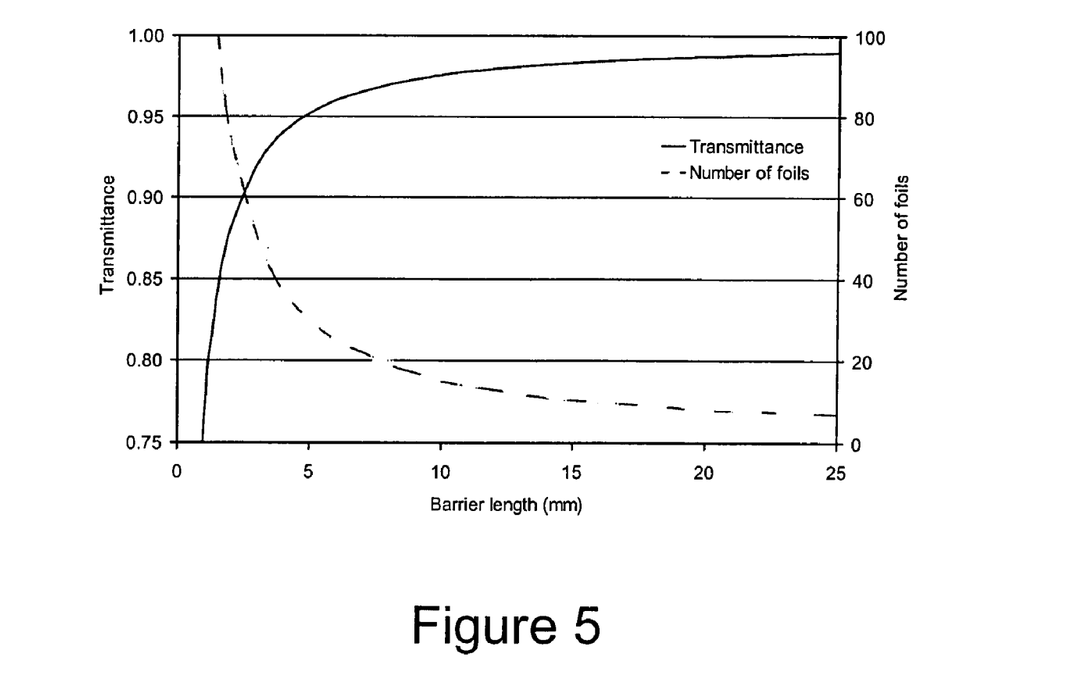
FIG. 5 shows a graph illustrating an optical transmittance and number of foils as a function of barrier length.

FIG. 5 shows a graph illustrating the optical transmission of the foil trap 2 depending on a collection half-angle $\alpha$, a rotating foil trap outer radius r1, a barrier length r2 and a foil thickness t. FIG. 5 illustrates that for increasing barrier length r2, a transmission increases from about 0.75 to about 1. In addition, a number of foils decrease from about 100 to about 10. It should be noted that the transmittance is nearly independent of a distance r1 of the rotating foil trap 2 (see FIG. 2): as a distance r1 increases, more foils are used for optically closing directions perpendicular to the axis of the rotation, but a smaller solid angle is blocked by each foil due to the increased distance.

For a typical configurations having a half-angle of $\alpha=85°$, the foil trap radius r1=60 mm, the radius of the second foil trap 4=20 mm, and a thickness of foils 6=0.1 mm, nearly 8 foils are used, barely influencing an optical transmittance.

In comparison with the FIG. 2 embodiment, the "wheel of fortune" embodiment of FIG. 3 may use additional foils to optically close the emission angle relative to the radiation source. For a typical configuration having an half-angle of emission of 85°, a foil trap radius of 60 mm, and a radius for the barrier 20 mm, having identical thickness of 0.1 mm, preferably 28 foils are used, leading to a optical transmittance of about 96%. Here, since the area around the optical axis is transparent for debris, this area is preferably closed in an angle of around 2°, blocking less than 2% of a total collectable solid angle.

Although in the FIG. 2 and FIG. 3 embodiments only a sectional view is illustrated, both embodiments may be comprised of conically shaped foil traps 4, 40. The apex of the cones coincides with central location 7 and the axis of the cones formed by foils 6, 60 typically coincides with a rotation axis although other directions are allowed. In principle the rotational symmetry of the foil trap 4 results in foils that are typically aligned, in addition to the radial direction relative to the source, in a tangential direction with respect to the symmetry axis defined by the foil trap 4, 40. That is, preferably the foils are generally conical in shape but also planar shapes are possible for instance a multi-angled shape. Such a planar foil has a cross section that is multi angled, for instance octagonal instead of circular. These types of foils may be easier to manufacture although the performance may be a little less then conically shaped foils and cleaning aspects may be a little more difficult. In another embodiment, the foils 40 do not extend fully around the first foil trap 20 (although this may be preferred for cleaning purposes), but cover at least the angles in which radiation is collected. In this case, they are not rotationally symmetric, but are still configured around a central axis that coincides with the axis of rotation 3a. Other embodiments are possible, in particular embodiments wherein the foils are modified to prevent Sn from falling off, except on a position above channel 8 in FIG. 4. The foils may be provided with anti-wetting coating or a small edge.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further although the invention has been primarily explained with reference to a radiation system as a separate embodiment, it may be integral to the lithographic apparatus. The lithographic apparatus further typically and preferably comprises a collector element discussed here above for receiving and collecting extreme ultraviolet radiation generating from the radiation system. Thus, the collector element will define a collection angle. The debris intercepting system according to the invention is typically arranged between the rotating foil trap and the collector element. Further typically the collector element may be cylindrically symmetric and be comprised of concentrically curved reflecting surfaces, which provide a grazing incidence reflection for extreme ultraviolet radiation. These surfaces may be stacked at distances ranging substantially between about 2 and about 7 centimeters in alternative embodiments the collector element can be of a normal incidence type known in the art.

Further it has been shown that the debris prevention system according to the invention can be used as a separate system but also can be used as an element in a lithographic apparatus. Accordingly a lithographic apparatus has been demonstrated comprising illumination system configured to condition a radiation beam.

A support may be constructed to support a patterning device, the patterning device being capable of imparting the radiation beam with a pattern in its cross-section to form a patterned radiation beam. In addition, a substrate table may be constructed to hold a substrate and a projection system may be configured to project the patterned radiation beam onto a target portion of the substrate. In this lithographic apparatus, preferably, the debris prevention system according to the above described embodiment is provided.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A debris prevention system constructed and arranged to prevent debris emanating from a radiation source from propagating with radiation from the radiation source into or within a lithographic apparatus, the debris prevention system, comprising:
   a first foil trap rotatable around an axis of rotation; and
   a second foil trap at least partly enclosing said first foil trap, said second foil trap comprising a plurality of foils optically open respective to a central location for placement of a radiation source and optically closed respective to directions perpendicular to the axis of rotation, wherein, for an angle β increasing between 0 and 90° relative to the rotation axis, the foils of the second foil trap have an interspacing at distances decreasing with said angle β.

2. A debris prevention system according to claim 1, further comprising an optical system, wherein an optical axis defined by the optical system coincides with the axis of rotation of the first foil trap.

3. A debris prevention system according to claim 1, further comprising an optical system, wherein an optical axis defined by the optical system is directed generally transverse to the axis of rotation of the first foil trap.

4. A debris prevention system according to claim 1, wherein the interspacing is such that for each line perpendicular to the axis of rotation, at least one foil and at most three foils of the second foil trap are intersected.

5. A debris prevention system according to claim 1, wherein a debris outlet channel is arranged at or near a lowest point of the second foil trap.

6. A debris prevention system according to claim 1, wherein the second foil trap is rotatable, and wherein a cleaning system is arranged to provide a cleaning action during rotation of the second foil trap.

7. A debris prevention system according to claim 6, wherein said cleaning system comprises a wiper arranged to perform a mechanical cleaning action.

8. A debris prevention system according to claim 6, wherein said cleaning system comprises a nozzle, arranged to direct a chemical cleaning substance towards the second foil trap.

9. A debris prevention system according to claim 6, wherein said second foil trap is arranged to rotate with a frequency ranging between about 0.1 Hz and about 10 Hz.

10. A debris prevention system according to claim 1, wherein the plurality of foils are generally conical in shape.

11. A debris prevention system according to claim 1, wherein the plurality of foils are generally planar in shape.

12. A debris prevention system according to claim 1, wherein the plurality of foils are generally rotationally symmetric about the axis of rotation of the first foil trap.

13. A debris prevention system according to claim 1, further comprising a discharge produced or a laser produced plasma source.

14. A debris prevention system according to claim 13, wherein the source comprises a plasma produced discharge source for generating extreme ultraviolet radiation, the discharge source comprising a pair of electrodes to be provided with a voltage difference, and a system for producing a discharge between said pair of electrodes so as to provide a pinched plasma in a central area between said electrodes.

15. A debris prevention system according to claim 14, wherein said plasma source comprises tin, lithium or xenon.

16. A debris prevention system according to claim 1, further comprising a collector element defining a collection angle, wherein said second foil trap is arranged between said first foil trap and said collector.

17. A debris prevention system according to claim 16, wherein said collector element is cylindrically symmetric and comprises concentrically curved reflective surfaces.

18. A debris prevention system according to claim 17, wherein said reflective surfaces are stacked at a distance ranging substantially between about 2 cm and about 7 cm.

19. A debris prevention system according to claim 18, wherein said collector element is of a normal incidence type.

20. A lithographic apparatus comprising:
   an illumination system configured to condition a radiation beam;
   a support constructed to support a patterning device, the patterning device being configured to impart the radiation beam with a pattern in its cross-section to form a patterned radiation beam;
   a substrate table constructed to hold a substrate; and
   a projection system configured to project the patterned radiation beam onto a target portion of the substrate; and
   a debris prevention system configured to provide said radiation beam, the debris prevention system being constructed and arranged to prevent debris emanating from a radiation source from propagating with radiation from the radiation source into or within the lithographic apparatus, the debris prevention system, comprising
   a first foil trap rotatable around an axis of rotation; and
   a second foil trap at least partly enclosing said first foil trap, said second foil trap comprising a plurality of foils optically open respective to a central location for placement of a radiation source and optically closed respective to directions perpendicular to the axis of rotation, wherein, for an angle β increasing between 0 and 90° relative to the rotation axis, the foils of the second foil trap have an interspacing at distances decreasing with said angle β.

* * * * *